United States Patent
Kane et al.

(10) Patent No.: US 9,170,273 B2
(45) Date of Patent: Oct. 27, 2015

(54) HIGH FREQUENCY CAPACITANCE-VOLTAGE NANOPROBING CHARACTERIZATION

(71) Applicant: International Business Machines Corporation, Armonk, NY (US)

(72) Inventors: Terence L. Kane, Wappingers Falls, NY (US); Matthew F. Stanton, Salt Point, NY (US); Michael P. Tenney, Poughkeepsie, NY (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 108 days.

(21) Appl. No.: 14/100,248

(22) Filed: Dec. 9, 2013

(65) Prior Publication Data

US 2015/0160261 A1 Jun. 11, 2015

(51) Int. Cl.
*G01Q 60/40* (2010.01)
*H01J 49/06* (2006.01)
*G01R 27/26* (2006.01)
*H01J 49/10* (2006.01)
*H01J 49/26* (2006.01)

(52) U.S. Cl.
CPC ............ *G01Q 60/40* (2013.01); *G01R 27/2605* (2013.01); *H01J 49/062* (2013.01); *H01J 49/10* (2013.01); *H01J 49/26* (2013.01)

(58) Field of Classification Search
CPC ............... H01L 22/20; G01R 31/2831; G01R 1/06711; G01R 1/07307; G01R 27/14; G01R 27/16; G01R 27/18; G01R 27/2676; G01Q 60/30; G01Q 60/46; G01Q 60/00; G01Q 60/48

See application file for complete search history.

(56) References Cited

U.S. PATENT DOCUMENTS

| | | | | |
|---|---|---|---|---|
| 3,995,213 | A * | 11/1976 | Robinson et al. | 324/715 |
| 5,214,389 | A * | 5/1993 | Cao et al. | 324/719 |
| 5,689,063 | A * | 11/1997 | Fujiu et al. | 73/105 |
| 6,426,499 | B1 * | 7/2002 | Koops | 850/41 |
| 6,504,152 | B2 * | 1/2003 | Hantschel et al. | 850/56 |
| 6,657,454 | B2 * | 12/2003 | Howland | 324/754.23 |
| 6,789,032 | B2 | 9/2004 | Barbour et al. | |
| 6,991,943 | B2 * | 1/2006 | Andoh et al. | 438/10 |
| 7,139,944 | B2 | 11/2006 | Barbour et al. | |
| 7,190,175 | B1 * | 3/2007 | Kelly et al. | 324/637 |
| 7,194,366 | B2 | 3/2007 | Singh et al. | |
| 7,205,237 | B2 * | 4/2007 | Deering et al. | 438/690 |
| 7,323,890 | B2 * | 1/2008 | Petersen et al. | 324/754.11 |

(Continued)

*Primary Examiner* — Nicole Ippolito
*Assistant Examiner* — Wyatt Stoffa
(74) *Attorney, Agent, or Firm* — Yuanmin Cai; Roberts Mlotkowski Safran & Cole, P.C.

(57) ABSTRACT

A method of generating a capacitance-voltage (C-V) characteristic for a discrete device formed within a semiconductor structure may include exposing first and second contact regions associated with the discrete device, coupling a high-frequency impedance probe having a frequency range of about 5 Mhz to about 110 Mhz to an impedance analyzer, and coupling the high-frequency impedance probe to a first and a second atomic force probe tip. Using an atomic force microscope, the first atomic force probe tip is coupled to the exposed first contact region and the second atomic force probe tip is coupled to the exposed second contact region. The C-V characteristic for the discrete device is then measured on the impedance analyzer, whereby the impedance analyzer applies an operating frequency corresponding to the frequency range of about 5 Mhz to about 110 Mhz to the first and second contact regions of the discrete device using the high-frequency impedance probe.

17 Claims, 7 Drawing Sheets

(56) References Cited

U.S. PATENT DOCUMENTS

| | | |
|---|---|---|
| 7,409,306 B2 | 8/2008 | Singh et al. |
| 7,451,646 B2 | 11/2008 | Cleland et al. |
| 7,893,703 B2 | 2/2011 | Rzepiela et al. |
| 8,933,707 B1 * | 1/2015 | Tsironis ................... 324/637 |
| 2002/0048973 A1 * | 4/2002 | Zhou et al. ................... 439/66 |
| 2002/0084790 A1 * | 7/2002 | Nakayama et al. ........... 324/715 |
| 2002/0153901 A1 * | 10/2002 | Davis et al. .................. 324/600 |
| 2004/0056674 A1 * | 3/2004 | Petersen et al. .............. 324/754 |
| 2004/0082176 A1 * | 4/2004 | Kane et al. ................... 438/690 |
| 2005/0124085 A1 * | 6/2005 | Andoh et al. .................. 438/17 |
| 2005/0127929 A1 * | 6/2005 | Petersen et al. .............. 324/756 |
| 2005/0285106 A1 * | 12/2005 | Kane et al. ..................... 257/48 |
| 2006/0030160 A1 * | 2/2006 | Kane et al. .................... 438/710 |
| 2006/0152232 A1 | 7/2006 | Shvets et al. |
| 2006/0213259 A1 * | 9/2006 | Prinz et al. ...................... 73/104 |
| 2006/0290363 A1 * | 12/2006 | Botelho ........................ 324/754 |
| 2007/0010097 A1 * | 1/2007 | Deering et al. ............... 438/690 |
| 2007/0024301 A1 * | 2/2007 | Petersen et al. ............... 324/754 |
| 2007/0075716 A1 * | 4/2007 | Gleason et al. ............... 324/754 |
| 2009/0230299 A1 * | 9/2009 | Shichi et al. .................. 250/282 |
| 2010/0163727 A1 | 7/2010 | Bell et al. |
| 2010/0253377 A1 * | 10/2010 | Strid et al. .................... 324/754 |
| 2011/0193085 A1 * | 8/2011 | Goulet et al. ................... 257/48 |
| 2012/0117696 A1 * | 5/2012 | Hatzistergos et al. .......... 850/60 |
| 2012/0146669 A1 | 6/2012 | Erickson |
| 2014/0295584 A1 * | 10/2014 | Kane ............................. 438/18 |

\* cited by examiner

HIGH FREQUENCY CAPACITANCE-VOLTAGE NANOPROBING CHARACTERIZATION

BACKGROUND a. Field of the Invention

The present invention generally relates to semiconductor device testing, and more particularly, to the enhancing capacitance-voltage (C-V) characteristic measurements of such semiconductor devices.

b. Background of Invention

Semiconductor device performance may be measured using a myriad of techniques and instruments. For example, in order to perform Atomic Force Probing (AFP) of a semiconductor device or structure, various layers may need to be removed for exposing the device or structure's contacts (e.g., tungsten studs) or surface prior to probing. Such layer removal or delayering may be carried out using either more coarse methods such as chemical mechanical polishing (CMP) or relatively high-precision techniques employing, for example, focused or collimated high-energy (>500 eV) ion beam etching. Such delayering techniques may, however, damage the device or structure's surface, or alternatively, introduce unwanted irregularities (e.g., unwanted ion implantation) into the device or structure. For example, the process used to prepare the device or structure prior to test or evaluation may undesirably introduce defects (e.g., gallium ion implantations due to high energy ion beam etching) or produce shifts in performance characteristics (e.g., MOSFET threshold voltage ($V_t$) shifts). This may subsequently be misconstrued as a device characteristic resulting from fabrication processes as opposed to a measurement induced defect.

In addition, once the delayering of the structure exposes, for example, a contact, the AC characteristics of the structure under test (e.g., FET device) may be determined. One important AC characteristic that may be used to, among other things, determine doping issues (i.e., concentration, distribution, etc.) is capacitive-voltage (C-V) measurements. However, as device geometries continue to reduce, AC characteristic measurements such as C-V measurements may become more challenging.

BRIEF SUMMARY

According to at least one exemplary embodiment, a method of generating a capacitance-voltage (C-V) characteristic for a discrete device formed within a semiconductor structure is provided. The method may include exposing first and second contact regions associated with the discrete device, coupling a high-frequency impedance probe having a frequency range of about 5 Mhz to about 110 Mhz to an impedance analyzer, and coupling the high-frequency impedance probe to a first and a second atomic force probe tip. Using an atomic force microscope, the first atomic force probe tip is coupled to the exposed first contact region and the second atomic force probe tip is coupled to the exposed second contact region. The C-V characteristic for the discrete device is then measured on the impedance analyzer, whereby the impedance analyzer applies an operating frequency corresponding to the frequency range of about 5 Mhz to about 110 Mhz to the first and second contact regions of the discrete device using the high-frequency impedance probe.

According to at least one other exemplary embodiment, a method of generating a capacitance-voltage (C-V) characteristic for a discrete device formed within a semiconductor structure may be provided. The method may include applying a voltage in the range of about 50 eV to less than 300 eV to an inductively coupled Argon ion source operating at a radio frequency; generating, from the Argon ion source, a collimated ion beam incident on a crystalline surface of the semiconductor structure for planar removal of layers of the crystalline surface, whereby the collimated ion beam minimizes surface amorphization of the crystalline surface of the semiconductor structure; exposing first and second contact regions underlying the crystalline surface of the semiconductor structure using an end-point detector based on the planar removal of the layers; coupling a high-frequency impedance probe having a frequency range of about 5 Mhz to about 110 Mhz to an impedance analyzer; coupling the high-frequency impedance probe to a first and a second atomic force probe tip; coupling, using an atomic force microscope, the first atomic force probe tip to the exposed first contact region; coupling, using the atomic force microscope, the second atomic force probe tip to the exposed second contact region; and measuring the C-V characteristic for the discrete device on the impedance analyzer, whereby the impedance analyzer applies an operating frequency corresponding to the frequency range of about 5 Mhz to about 110 Mhz to the first and second contact regions of the discrete device using the high-frequency impedance probe.

According to yet another exemplary embodiment, a system for generating a capacitance-voltage (C-V) characteristic for a discrete device formed within a semiconductor structure is provided. The system may include a high-frequency impedance probe having a frequency range of about 5 Mhz to about 110 Mhz; an impedance analyzer that couples to the high-frequency impedance probe; an atomic force microscope having a first and a second atomic force probe tip, whereby the first atomic force probe tip is coupled to both the high-frequency impedance probe and a first exposed contact region corresponding to the discrete device, and the second atomic force probe tip is coupled to both the high-frequency impedance probe and the second exposed contact region corresponding to the discrete device. The C-V characteristic for the discrete device is measured on the impedance analyzer based on the impedance analyzer applying an operating frequency corresponding to the frequency range of about 5 Mhz to about 110 Mhz to the first and the second exposed contact region of the discrete device using the high-frequency impedance probe.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following one or more exemplary embodiments describe, among other things, a low energy ion beam milling apparatus and method utilized for the purpose of delayering the surfaces of semiconductor devices for subsequent testing and characterization of such devices. The delayering of various surfaces of semiconductor devices, particularly three-dimensional semiconductor devices such as discrete FinFet transistor devices, may inadvertently introduce defects and unwanted artifacts within the devices. For example, a high-energy 500 eV focused gallium ion beam may, during the milling and delayering process of a FET device, cause a shift in the threshold voltage ($V_t$) of the FET device. Additionally, the high-energy ion beam may alter dopant density or dopant distribution. In all such cases, the device may be characterized incorrectly as a result of the induced irregularities or defects that are inadvertently introduced into the semiconductor device under tests based on the ion beam milling process.

Moreover, the following one or more exemplary embodiments describe, among other things, a capacitance-voltage (C-V) characteristic measurement system and method following the exposing of the contact regions of a discrete device (e.g., FinFet device) using the low energy ion beam milling apparatus. More particularly, as emerging semiconductor technology nodes continue to drive semiconductor device (FinFet(s), planar Fet(s), etc.) dimensionality down, these reduced geometry devices may present measurement challenges during AC characteristic measurements. Thus, an enhanced technique for measuring AC characteristics such as the capacitance-voltage (C-V) characteristic is described by the following exemplary embodiments.

Figure 1:
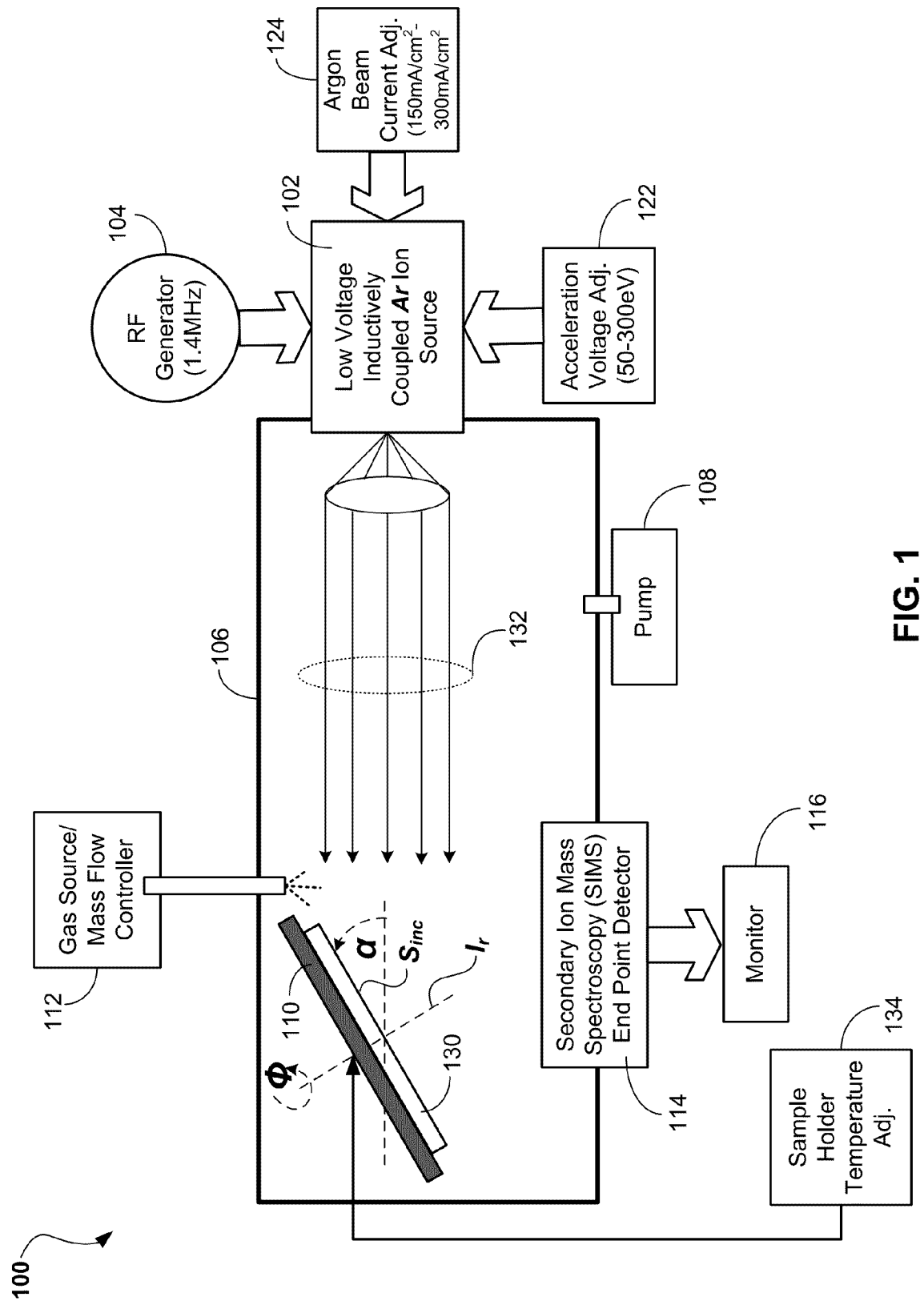
FIG. 1 is a system diagram of an ion beam milling apparatus according to an exemplary embodiment.

Referring to FIG. 1, a system diagram of an ion beam milling apparatus 100 according to an exemplary embodiment is depicted. The ion beam milling apparatus 100 may include a low voltage inductively coupled Argon (Ar) ion source 102, an RF signal source 104, a chamber 106 (e.g., stainless steel), a pump 108, a semiconductor device holder 110, a gas source/mass flow controller 112, a secondary ion mass spectroscopy (SIMS) end point detector 114, and an optional monitor 116 coupled to the SIMS detector 114.

As illustrated, a radio frequency (RF) signal source 104 generates a 1.4 MHz RF signal that is applied to the low voltage inductively coupled Argon (Ar) ion source 102. The low voltage inductively coupled Argon (Ar) ion source 102 also includes a means for adjusting the acceleration voltage 122 of the low voltage inductively coupled Argon (Ar) ion source 102 and a means for adjusting the Ar beam current 124 of the low voltage inductively coupled Argon (Ar) ion source 102.

The semiconductor device holder 110 may hold a semiconductor device under test (DUT) 130. The device holder 110 may accordingly have an adjustable angular orientation ($\alpha$) relative to an incident collimated ion beam 132 generated by the low voltage inductively coupled Argon (Ar) ion source 102. In addition to the angular orientation ($\alpha$), the semiconductor device holder 110 also rotates about its own axis, as denoted by $I_r$, at an adjustable rotational speed ($\phi$). The semiconductor device holder 110 may also include a means for adjusting its temperature 134.

In operation, the low voltage inductively coupled Argon (Ar) ion source 102 generates an inert low-energy collimated Ar ion beam 132 that is incident upon the DUT 130 that is placed and secured in the device holder 110. As shown in FIG. 1, the inert low-energy collimated ion beam 132 is incident upon DUT 130 at angular orientation $\alpha$. As the inert low-energy collimated ion beam 132 mills and, therefore, delayers incident surface $S_{inc}$ of the DUT 130, secondary ions generated at the surface $S_{inc}$ being etched are detected by the SIMS detector 114. The generated secondary ions may, for example, have characteristics such as mass-to-charge ratio which may differ based on the different layers of material that may be encountered during the milling operation. This distinction in characteristics may be used in order to provide a precise determination of the layer being milled. Using, for example, pulse counting, the SIMS detector 114 may generate a SIMS trace of counts per second (i.e., c/s) over time (i.e., t) for the detected secondary ions generated during the ion milling. These traces may be displayed graphically on monitor 116. Other diagnostic tools such as Fast Fourier Transform (FFT) analysis may be included with the SIMS detection process.

Based on the DUT 130 and the material that is to be delayered by the ion beam milling apparatus 100, different operating regimes may be employed by, for example, adjusting the acceleration voltage via adjustment means 122, adjusting the Ar beam current via adjustment means 124, adjusting the device holder 110 temperature via adjustment means 134, adjusting the chamber 106 pressure via pump 108, setting the angular orientation ($\alpha$) and rotational speed ($\phi$) of the device holder 110, applying an RF signal to the low voltage inductively coupled Argon (Ar) ion source 102, and the application (optionally) of etch selective gases via the gas source/mass flow controller 112. For example, etch selective hexafluoroethane ($C_2F_6$) gas may be used for removing silicon nitride hardmask materials and etch selective tetrafluoromethane ($CF_4$) gas may be used for removing silicon oxide. In the context of ion beam milling and Atomic Force Probing (AFP), both silicon oxide and silicon nitride layers may cause damage to the probes used in the AFP process. Thus, these layers are removed prior to AFP.

Figure 2:
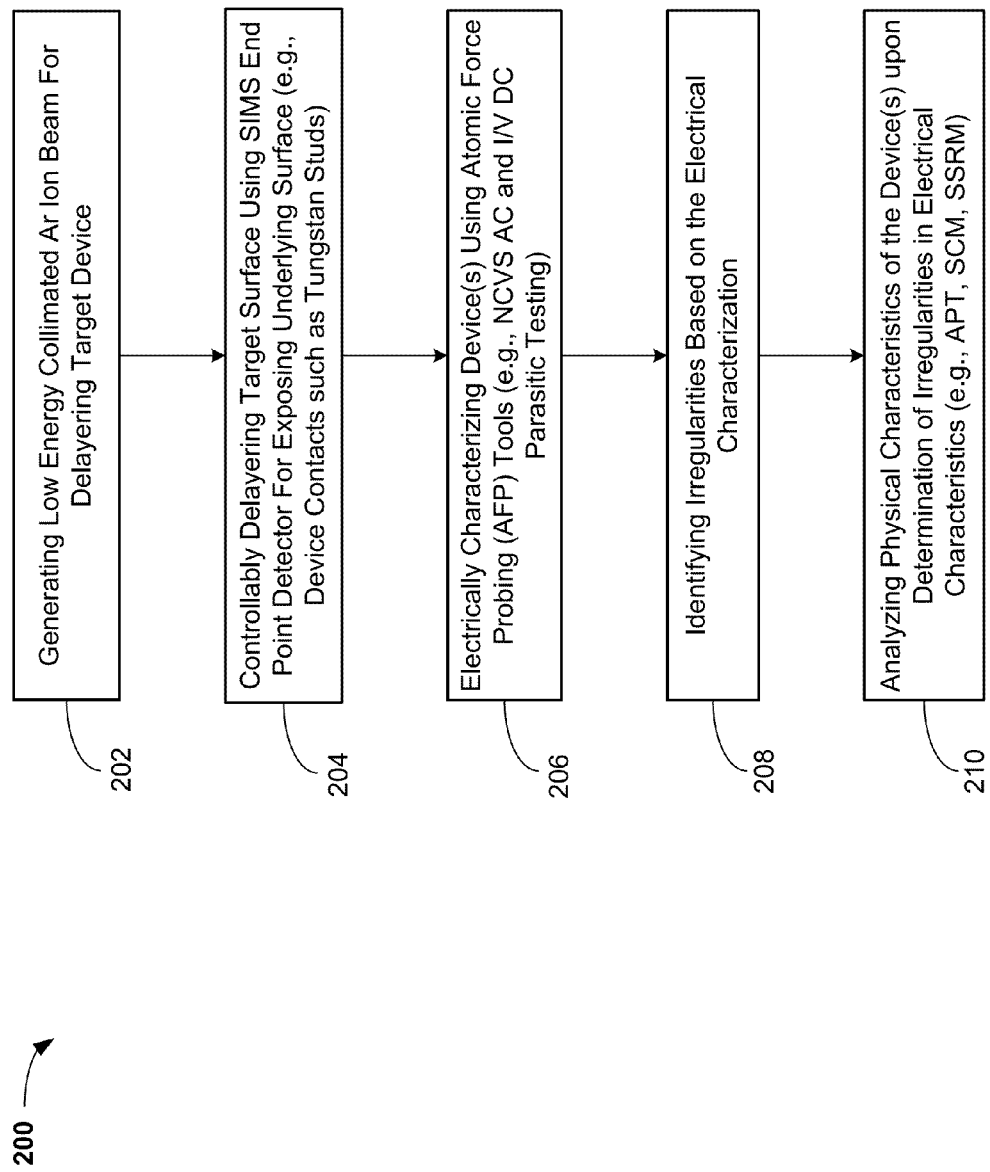
FIG. 2 is a process flow diagram corresponding to a testing process associated with a semiconductor structure according to an exemplary embodiment.

FIG. 2 is a process flow diagram 200 corresponding to a testing process associated with a semiconductor structure according to an exemplary embodiment. At 202, a low-energy collimated inert Ar ion beam may be generated by an apparatus, such as apparatus 100 (FIG. 1), for delayering a target device under test (DUT).

At 204, based on the generated low-energy collimated inert Ar ion beam (202), a controlled delayering of the target surface of the DUT is accomplished using, for example, a SIMS endpoint detector such as SIMS detector 114 (FIG. 1). For example, layers of copper my be removed by the generated low-energy collimated inert Ar ion beam in order to expose the tungsten studs corresponding to a Field Effect Transistor (FET) selected for characterization testing. Once exposed, using AFP, the tungsten studs may be probed for characterizing the FET device. Alternative examples may include delayering silicon nitride or silicon oxide layers that have been deposited on three-dimensional (3D) semiconductor structures such the Fins of FinFET type devices. In this example, the 3D structure may be especially susceptible to the impact of a high-energy ion beam milling process. For example, the electrical probing (e.g., Atomic Force Probing) of a Fin structure may require the removal of a silicon nitride hard mask (i.e., with etch selective hexafluoroethane gas —$C_2F_6$) located on the top surface of the Fin. Since the Fin may have a thickness dimension in the region 10-15 nm, an incident high-energy ion beam (e.g., >500 eV) may cause amorphization damage to the Fin, which in turn may be reflected in the subsequently obtained characterization results (e.g., current-voltage I/V curves, APT measurements, SSRM measurements, SCM measurements, etc.) associated with the device (i.e., FinFET device).

At 206, once the desired area or surface of the DUT is exposed (204), the device may be electrically characterized using Atomic Force Probing (AFP) tools such as, but not limited to, Nanoprobe Capacitance-Voltage (C-V) Spectroscopy (NCVS) AC based parasitic testing and Current-Voltage (I/V) DC based parasitic testing.

As further described below, an enhanced C-V nanoprobe apparatus (e.g., see FIGS. 4-5) may be utilized in order to provide C-V measurements at the level of discrete devices. For example, a discrete 3D device such as a FinFET may be ion milled using the above described ion beam milling apparatus 100 (FIG. 1) in order to expose contact regions associated with the device.

At 208, any irregularities or characteristic defects in the DUT may be identified based on an evaluation of the results of the electrical characterization obtained during the AFP process (206). Based on the detection of such irregularities or defects (208), at 210, the physical characteristic of the DUT are further evaluated using, for example, Atomic Probe Tomography (APT), Scanning Capacitance Microscopy (SCM), and/or Scanning Spreading Resistance Microscopy (SSRM). AFT may be utilized to determined doping concentration, while SSRM techniques may be indicative of dopant distribution associated with the DUT. SCM may be used to evaluate carrier density.

Figure 3:
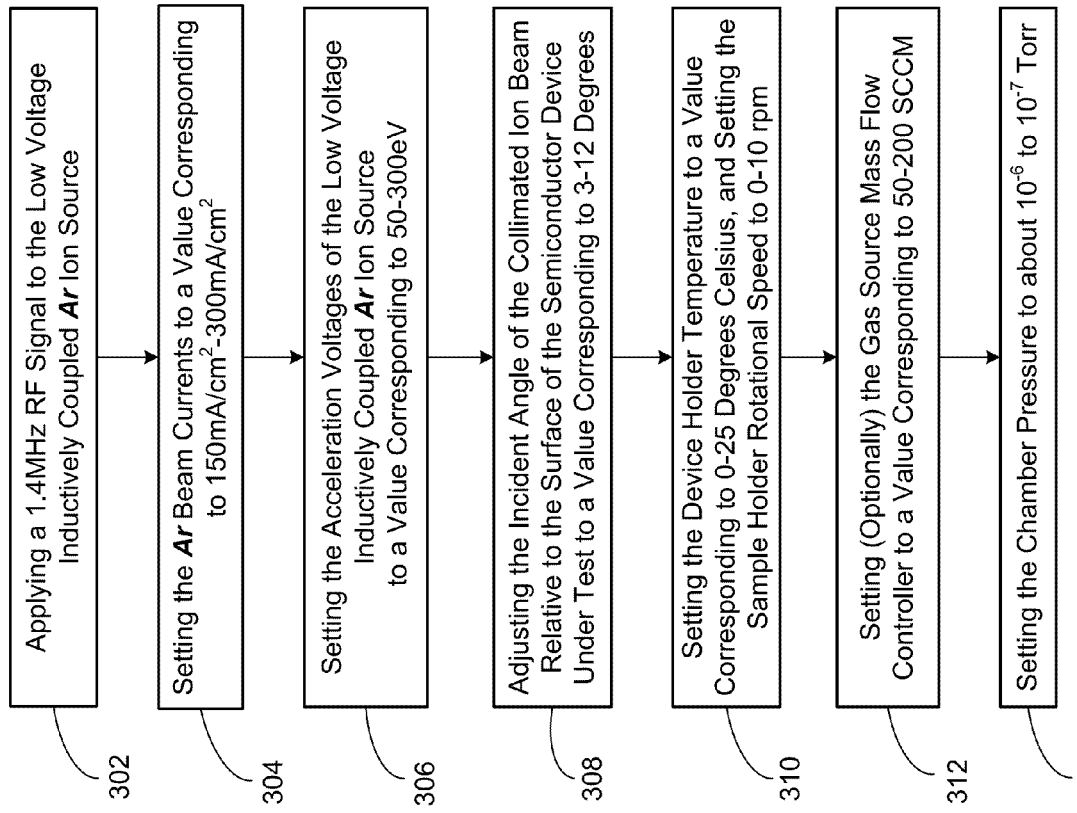
FIG. 3 is flow diagram corresponding to configuring the ion beam milling apparatus of FIG. 1 according to an exemplary embodiment.

FIG. 3 is flow diagram 202 corresponding to configuring the ion beam milling apparatus of FIG. 1 according to an exemplary embodiment. The following settings allow the generation of a collimated low-energy (<300 eV) inert Ar ion beam that provides delayering without altering the characteristics of the device under test (DUT). The settings include a range of values based on the DUT and the material that is being delayered. The flow diagram 202 of FIG. 3 is described with the aid of FIG. 1.

At 302, a radio frequency signal of 1.4 MHz or approximately 1.4 Mhz is applied to the low voltage inductively coupled Argon (Ar) ion source 102. The Ar Beam current may be set to a value between 150 mA/cm$^2$-300 mA/cm$^2$ (304). The acceleration voltage of the low voltage inductively coupled Argon (Ar) ion source 102 may be set to a value of about 50 eV to a value less than 300 eV (306).

At 308, the incident angle α between the incident collimated Ar beam 132 and the surface $S_{inc}$ of the DUT 130 that is held by semiconductor device holder 110 within the stainless steel chamber 106 may be adjusted to be around 3-12 degrees. Greater or lesser angles may also be contemplated.

At 310, the device holder 110 temperature may be adjusted to be about 0-25 degrees Celsius, while the device holder 110 rotational speed (φ) may be varied to be between about 0-10 revolutions per minute (rpm). At 312, depending on the material that is being delayered, etching gas (e.g., $C_2F_6$, $CF_4$) may be applied within the chamber 106 at a flow rate of between 50 to about 200 standard cubic centimeters per minute (SCCM). For example, in some instances etching gases may not be utilized. One example of not using an etch-selective gas may be during the delayering of copper material for exposing tungsten studs prior to the AFP process. At step 314, the chamber pressure may be set to be about $10^{-6}$ to about $10^{-7}$ Torr, although lesser or greater pressures may also be contemplated.

It may be appreciated that the various processes of FIG. 3 may be carried out in no particular order prior to delayering the DUT 130. As previously mentioned, the various adjustment parameters described in relation to FIG. 3 may be set and, in some instances, readjusted based on DUT type (e.g., 3D devices such as FinFETs) and/or the material on the DUT being delayered (e.g., copper, silicon nitride, etc.).

Once exposed using the milling apparatus 100, an enhanced C-V nanoprobe apparatus may determine the C-V characteristic and, therefore, various electrical anomalies. As the geometry of the discrete devices reduce, their corresponding sensitivity for obtaining C-V characteristics accordingly reduces. The following described embodiments may, therefore, enhance, among other things, measurement sensitivity for obtaining the C-V characteristics.

Figure 4A:
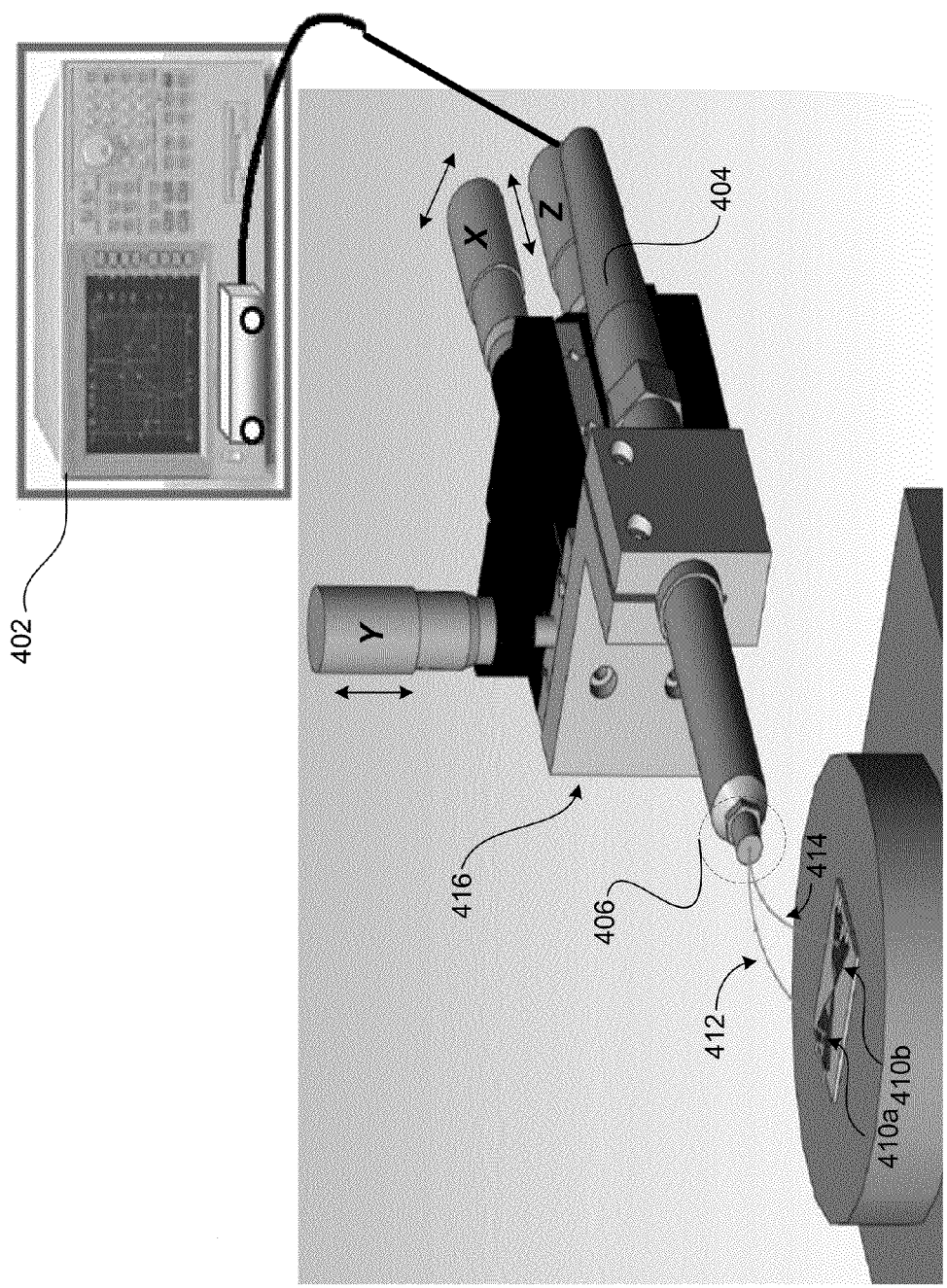
FIG. 4A is a perspective view of atomic force probe tips of an atomic force prober apparatus during C-V characteristic measurements according to an exemplary embodiment.
Figure 4B:
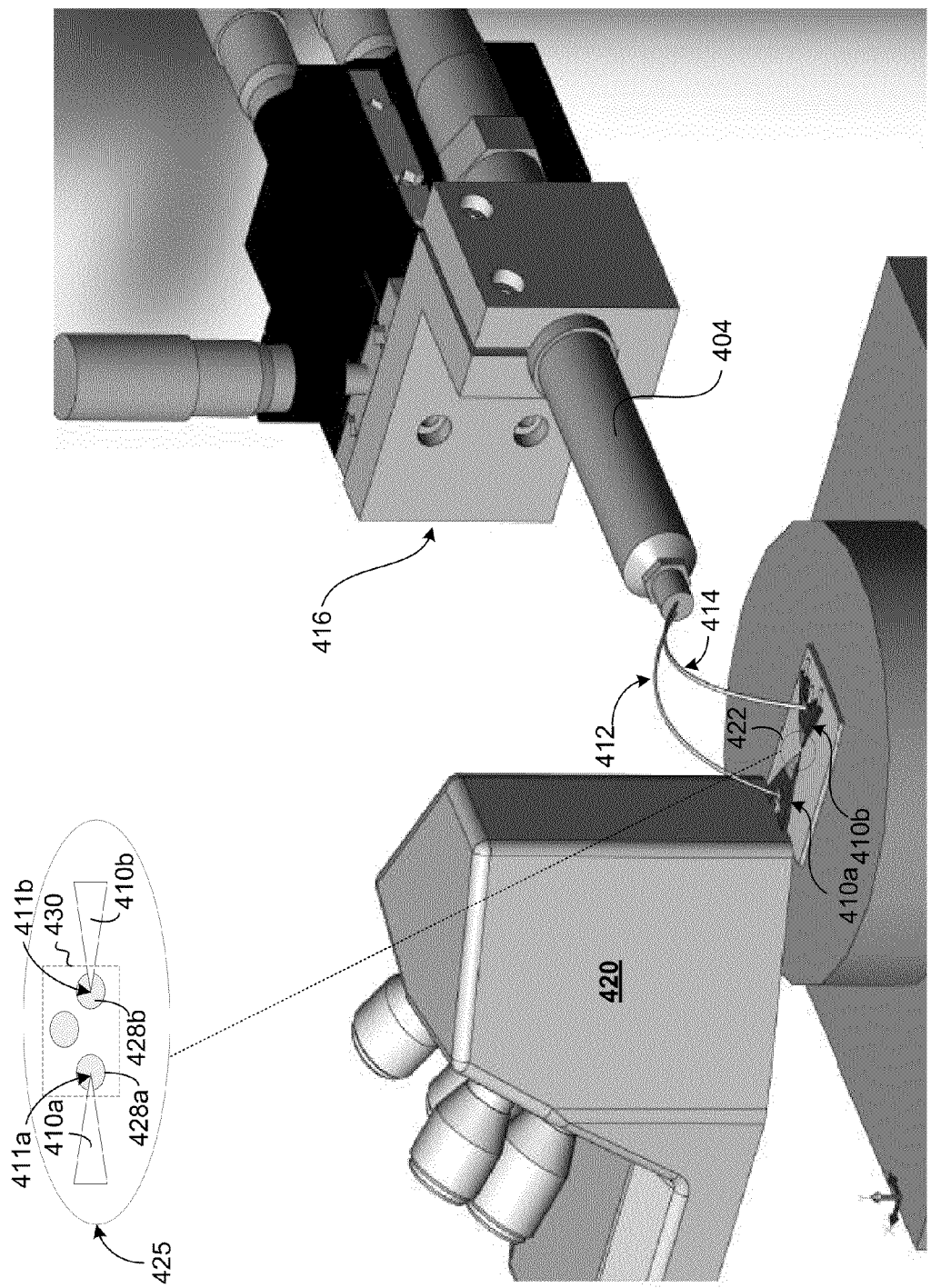
FIG. 4B is yet another perspective view of atomic force probe tips of an atomic force prober apparatus during C-V characteristic measurements according to an exemplary embodiment.

FIGS. 4A-4B is a perspective view of atomic force probe tips of an atomic force prober apparatus during C-V characteristic measurements according to an exemplary embodiment. Referring to FIG. 4A, an impedance analyzer 402 such as, for example, a 4294A precision impedance analyzer manufactured by Agilent Technologies®, headquartered in Santa Clara, Calif., may be coupled to and used to drive a high-frequency impedance probe 404 such as, for example, a 42941A impedance probe also manufactured by Agilent Technologies®. As depicted, the end portion 406 of the high-frequency impedance probe 404 is coupled to a pair of atomic force probe tips 410a, 410b via, for example, a SMA type cable arrangement.

The SMA type cable arrangement may include SMA cable 412 and SMA cable 414, whereby SMA cable 412 may couple to the ground connection of the high-frequency impedance probe 404 and SMA cable 414 may accordingly couple to the signal conductor connection of the high-frequency impedance probe 404. The length of the SMA cables may be selected to be about 5 millimeters (mm) or less in order to, among other things, reduce capacitance losses due to transmission line reflections. In order to configure the impedance analyzer 402 to measure the C-V characteristics at a high-frequency range of about 5 Mhz-110 Mhz, measurement losses should be minimized. Thus, in addition to utilizing a low-loss/short cabling arrangement (e.g., 5 mm SMA cables 412, 414) capable of operating over a frequency range of approximately 5 Mhz-110 Mhz, the tension of the cables 412, 414 may also be manipulated by holding the high-frequency impedance probe 404 with a XYZ manipulation stage 416. More specifically, the tension of the cables 412, 414 may be varied by manipulating the probe 404 along one or more of the X, Y, or Z axes, as depicted. Optimization of the C-V measurement based on tension adjustment may be verified by, for example, viewing the C-V curves captured by the impedance analyzer 402.

Referring to FIG. 4B, a positional manipulation stage 420 associated with an atomic force microscope (not shown) may be used for positioning atomic force probe tip 410a. Likewise, another positional manipulation stage (not shown for illustrative brevity) associated with the atomic force microscope may be used for positioning the other atomic force probe tip 410b. Using the atomic force microscope, the positional manipulation stages (e.g., positioning manipulation stage: 420) may be utilized for coupling the atomic force probe tips 410a, 410b to, for example, exposed contact regions of a discrete device (e.g., FinFET, planar FET, etc.), as indicate at 422. An expanded view 425 of area 422 illustrates atomic force probe tip 410a coupled to an exposed contact region 428a of a discrete device 430 associated with the DUT (e.g., FIG. 1: 130). Similarly, expanded view 425 of area 422 also shows atomic force probe tip 410b coupled to an exposed contact region 428b of the discrete device 430 associated with the DUT (e.g., FIG. 1: 130). For example, exposed contact region 428a may include a source contact region of a FinFet device, while exposed contact region 428b may include a drain contact region of the FinFet device. As described above in relation to the ion milling process, the exposed contact regions 428a, 428b that are probed using the respective atomic force probe tips 410, 410b may be exposed using low energy ion beam milling apparatus 100 (FIG. 1).

As depicted, the electrical cables 412, 414 providing an electrical connection between the impedance probe 404 and the atomic force probe tips 410a, 410b may be made to, for example, a ground and a signal connection at the base portion of the atomic force probe (AFP) tips 410a, 410b. This connection at the base portion is made without impeding the movement of the cantilever composed of the AFP mirrors (not shown) and the AFP tip ends 411a, 411b (e.g., including tungsten tip ends).

Figure 5:
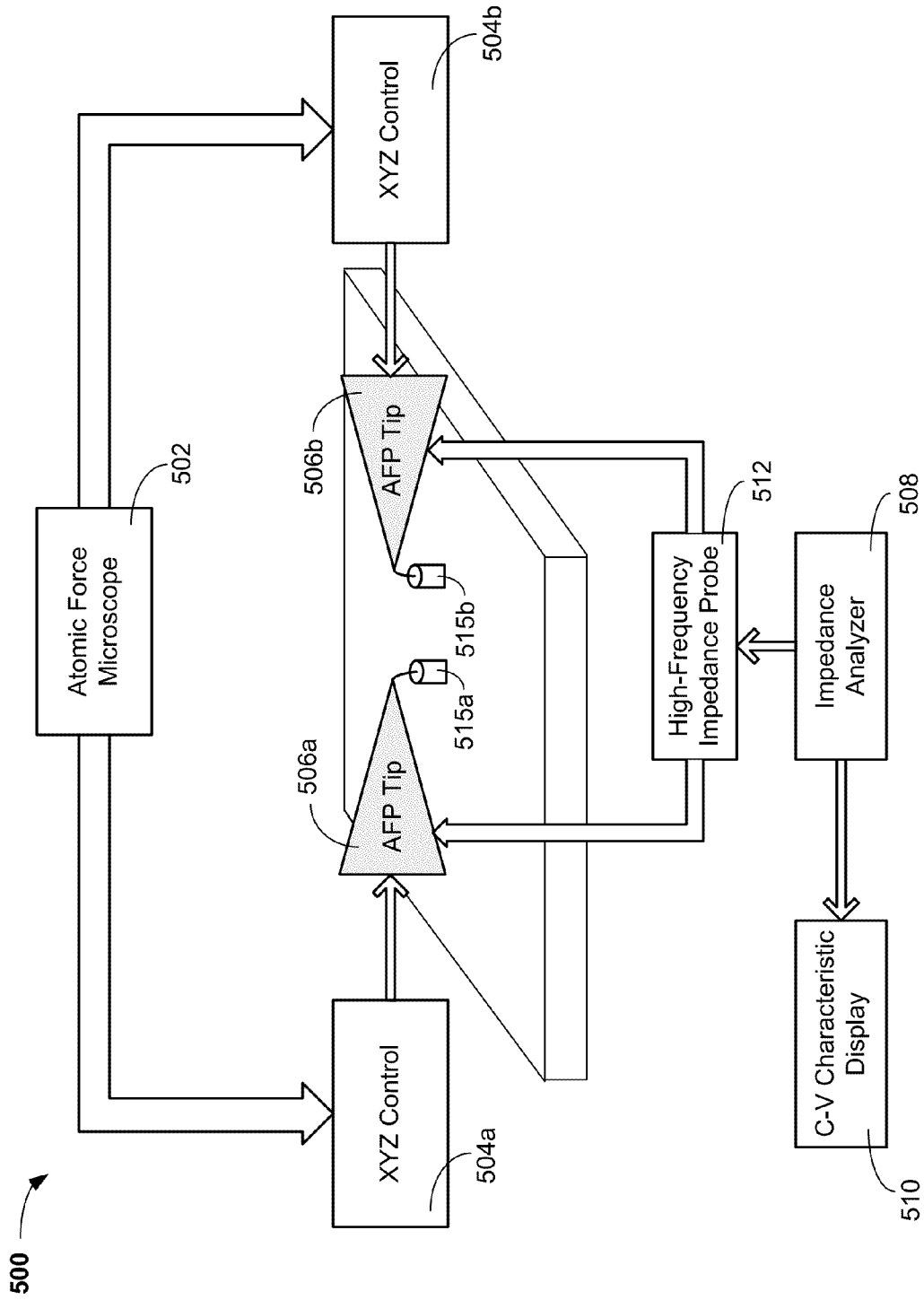
FIG. 5 is a block diagram of a capacitance-voltage (C-V) characteristic measurement system according to an exemplary embodiment.

FIG. 5 is a block diagram of a capacitance-voltage (C-V) characteristic measurement system 500 according to an exemplary embodiment. The capacitance-voltage (C-V) characteristic measurement system 500 may include an atomic force microscope (AFM) 502, positional manipulation stage 504a, atomic force probe (AFP) tip 506a coupled to positional manipulation stage 504a, positional manipulation stage 504b, atomic force probe (AFP) tip 506b coupled to positional manipulation stage 504b, an impedance analyzer 508 configured to generate a C-V characteristic display 510, and a high-frequency impedance probe 512 coupled to the impedance analyzer 508, whereby the high-frequency impedance probe 512 is electrically connected to AFP tips 506a and 506b. It may be appreciated that a more detailed perspective view of the high-frequency impedance probe 512 being electrically coupled to exposed regions 515a and 515b of a discrete device under test (DUT) via AFP tips 506a and 506b is also depicted and described in relation to FIGS. 4A and 4B. The operation of capacitance-voltage (C-V) characteristic measurement system 500 is described below with the aid of the flow diagram 600 of FIG. 6.

Figure 6:
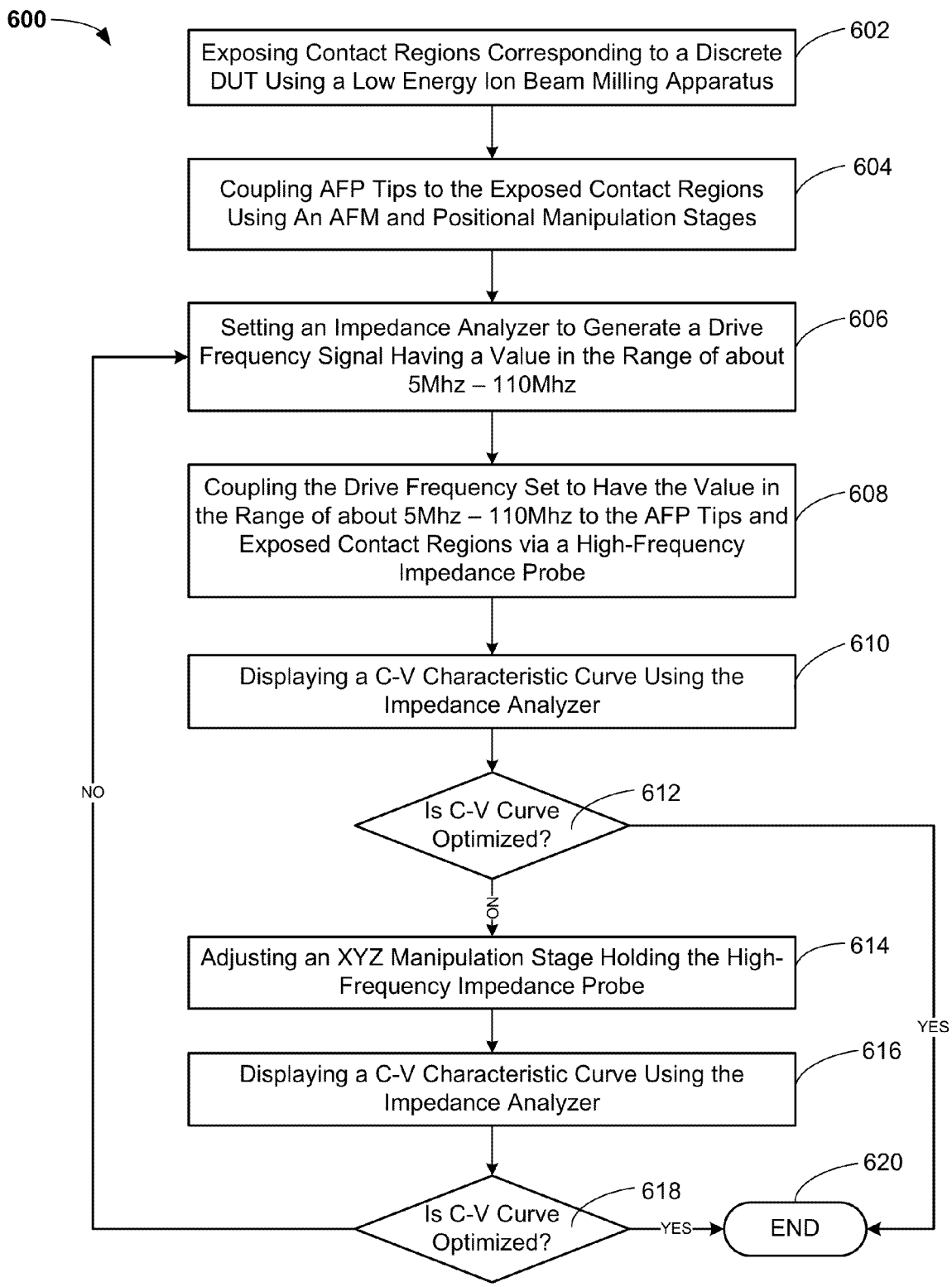
FIG. 6 is an operational flow diagram corresponding to the capacitance-voltage (C-V) characteristic measurement system embodiment depicted in FIG. 5.

Referring to FIG. 6, at 602 the contact regions 515a and 515b of a discrete device under test (DUT) are exposed using a low energy ion beam milling apparatus such as the exemplary embodiment depicted in FIG. 1. As previously described, low energy ion beam milling apparatus 100 (FIG. 1) may provide ion beam milling, while mitigating undesirably introduced defects or produced shifts in performance characteristics (e.g., MOSFET threshold voltage ($V_t$) shifts).

At 604, the AFP tips 506a, 506b are coupled to exposed contact regions 515a and 515b, whereby using the AFM 502, the positional manipulation stages 504a, 504b facilitate electrically connecting the AFP tips 506a, 506b to the exposed contact regions 515a and 515b. Once the electrical connectivity between the exposed contact regions 515a, 515b and the AFP tips 506a, 506b is established, at 606 the impedance analyzer 508 is set to generate a drive frequency signal having a value of about 5 Mhz-110 Mhz. This frequency range may facilitate the provision a high-frequency signal that enables an increased sensitivity when generating C-V measurements on the impedance analyzer 508. This increased sensitivity may be of significance as the physical geometry (e.g., Fin length) of discrete devices (e.g., FinFET) is reduced with advancing node technologies (e.g., 14 nm and below).

At 608, the set drive frequency signal having a value in the range of about 5 Mhz-110 Mhz is coupled from the impedance analyzer 508 to the AFP tips 506a, 506b via high-frequency impedance probe 512. At 610, the C-V characteristic curve of the DUT is generated and displayed using the impedance analyzer 508. If, at 612 it is determined that an optimized C-V curve is generated, the process ends at 620.

If, however, at 612 it is determined that the C-V curve is not optimized (e.g., no generated C-V curve, etc.), at 614, an XYZ manipulation stage holding the high-frequency impedance probe 512 may be adjusted. Upon adjustment of the XYZ manipulation stage holding the high-frequency probe 512 (614), the C-V characteristic curve of the DUT is again generated and displayed using the impedance analyzer 508 in order to further determine whether an optimized C-V curve is generated (618). If, at 618 an optimized C-V curve is generated, the process ends (620).

An embodiment of a XYZ manipulation stage 416 holding a high-frequency impedance probe 404 is depicted in FIGS. 4A and 4B. Thus, the high-frequency impedance probe 512 represented in the block diagram of FIG. 5 may be implemented in the same, or substantially the same, manner as that depicted and described in relation to FIGS. 4A and 4B. More specifically, as previously described, the tension of the cables 412, 414 coupling the probe 404 to the AFP tips 410a, 410b may be varied by manipulating the probe 404 along one or more of the X, Y, or Z axes, as depicted. Optimization of the C-V measurement based on tension adjustment may, therefore, be verified by, for example, viewing the C-V curves captured by the impedance analyzer 402.

If, at 618 an optimized C-V curve is still not generated, the process returns to 606, whereby the impedance analyzer 508 is set to generate another drive frequency signal having a value of about 5 Mhz-110 Mhz. As described above, the C-V curve optimization process then continues in based on processes 610-620.

The one or more exemplary embodiments described above may provide, among other things, an apparatus and method of generating C-V characteristic measurements for discrete devices, such as MOSFET devices, embedded DRAM devices, FinFET devices, etc. The measurements may therefore, for example, facilitate detecting charge extraction of trapped charge in gate dielectric films and high-K gate films, enabling threshold $V_t$ measurements of FinFET and planar MOSFET devices, detecting AC defects that are undetectable by conventional DC measurements, measuring eDRAM deep trench capacitor measurements, enabling contact level capacitance measurements of devices, as well measuring and evaluating dopant concentration and distribution issues.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:
1. A method of generating a capacitance-voltage (C-V) characteristic for a discrete device formed within a semiconductor structure, the method comprising:
 exposing first and second contact regions associated with the discrete device, wherein the exposing of the first and second contact regions includes:

applying a voltage in the range of about 50 eV to less than 300 eV to an inductively coupled Argon ion source operating at a radio frequency;

generating, from the Argon ion source, a collimated ion beam incident on the surface of the semiconductor structure corresponding to the first and second contact regions for planar removal of layers of the surface; and controlling exposure of the first and second contact regions underlying the surface of the semiconductor structure using an end-point detector based on the planar removal of the layers;

coupling a high-frequency impedance probe having a frequency range of about 5 Mhz to about 110 Mhz to an impedance analyzer;

coupling the high-frequency impedance probe to a first and a second atomic force probe tip;

coupling, using an atomic force microscope, the first atomic force probe tip to the exposed first contact region;

coupling, using the atomic force microscope, the second atomic force probe tip to the exposed second contact region; and measuring the C-V characteristic for the discrete device on the impedance analyzer, the impedance analyzer applying an operating frequency corresponding to the frequency range of about 5 Mhz to about 110 Mhz to the first and second contact regions of the discrete device using the high-frequency impedance probe.

2. The method of claim 1, wherein the generated collimated ion beam is incident on the surface of the semiconductor structure at an angle of about 3-12 degrees.

3. The method of claim 1, wherein the radio frequency (RF) comprises a 1.4 MHz signal.

4. The method of claim 1, wherein the end-point detector comprises a secondary ion mass spectroscopy (SIMS) detector.

5. The method of claim 1, wherein the planar removal of layers comprises removing layers of silicon nitride using etch selective hexafluoroethane ($C_2F_6$) gas.

6. The method of claim 1, wherein the planar removal of layers comprises removing layers of silicon oxide using etch selective tetrafluoromethane ($CF_4$) gas.

7. The method of claim 1, wherein the planar removal of layers comprises removing layers of copper metallization.

8. The method of claim 1, wherein the discrete device comprises a FinFET transistor structure.

9. The method of claim 1, wherein the exposed first and second contact regions comprises tungsten studs coupled to the discrete device.

10. The method of claim 1, wherein the C-V measurement is utilized to determine doping concentration in the discrete device.

11. The method of claim 1, wherein the high-frequency impedance probe is coupled to a first and a second electrical conductor, the first electrical conductor coupled to a ground connection of the high-frequency impedance probe and the second electrical conductor coupled to a signal conductor of the high-frequency impedance probe.

12. The method of claim 11, wherein the first electrical conductor is coupled to the first atomic force probe tip and the second electrical conductor is coupled to the second atomic force probe tip.

13. A method of generating a capacitance-voltage (C-V) characteristic for a discrete device formed within a semiconductor structure, the method comprising:

applying a voltage in the range of about 50 eV to less than 300 eV to an inductively coupled Argon ion source operating at a radio frequency;

generating, from the Argon ion source, a collimated ion beam incident on a crystalline surface of the semiconductor structure for planar removal of layers of the crystalline surface, wherein the collimated ion beam minimizes surface amorphization of the crystalline surface of the semiconductor structure;

controlling exposure of first and second contact regions underlying the crystalline surface of the semiconductor structure using an end-point detector based on the planar removal of the layers;

coupling a high-frequency impedance probe having a frequency range of about 5 Mhz to about 110 Mhz to an impedance analyzer;

coupling the high-frequency impedance probe to a first and a second atomic force probe tip;

coupling, using an atomic force microscope, the first atomic force probe tip to the exposed first contact region;

coupling, using the atomic force microscope, the second atomic force probe tip to the exposed second contact region; and measuring the C-V characteristic for the discrete device on the impedance analyzer, the impedance analyzer applying an operating frequency corresponding to the frequency range of about 5 Mhz to about 110 Mhz to the first and second contact regions of the discrete device using the high-frequency impedance probe.

14. The method of claim 13, wherein the generated collimated ion beam is incident on the surface of the semiconductor structure at an angle of approximately 3-12 degrees.

15. The method of claim 13, wherein the radio frequency (RF) comprises a 1.4 MHz signal.

16. A system for generating a capacitance-voltage (C-V) characteristic for a discrete device formed within a semiconductor structure, the system comprising:

a high-frequency impedance probe having a frequency range of about 5 Mhz to about 110 Mhz;

an impedance analyzer that couples to the high-frequency impedance probe;

an atomic force microscope having a first and a second atomic force probe tip, the first atomic force probe tip being coupled to both the high-frequency impedance probe and a first exposed contact region corresponding to the discrete device, and the second atomic force probe tip being coupled to both the high-frequency impedance probe and the second exposed contact region corresponding to the discrete device, wherein the C-V characteristic for the discrete device is measured on the impedance analyzer based on the impedance analyzer applying an operating frequency corresponding to the frequency range of about 5 Mhz to about 110 Mhz to the first and the second exposed contact region of the discrete device using the high-frequency impedance probe; and an ion beam milling apparatus for exposing the first and the second contact region associated with the discrete device, wherein the ion beam milling apparatus includes:

an inductively coupled Argon ion source that operates at a radio frequency of about 1.4 MHz and an acceleration voltage in the range of about 50 eV to less than 300 eV, wherein the Argon ion source generates a collimated ion beam incident on the semiconductor structure at a location corresponding to the first and the second contact region, and wherein the first and the second contact region underlying a surface of the semiconductor structure is controllable exposed using an end-point detector.

17. The system of claim 16, further comprising:
an XYZ manipulation stage that holds the high-frequency impedance probe, the XYZ manipulation stage manipulating the XYZ position of the high-frequency impedance probe for optimizing the measured C-V characteristic for the discrete device by controlling both a first physical tension associated with a first electrical conductor coupled to a ground connection of the high-frequency impedance, and a second physical tension associated with a second electrical conductor coupled to a signal conductor of the high-frequency impedance probe.

* * * * *